(12) United States Patent
Kothandaraman

(10) Patent No.: US 9,721,646 B1
(45) Date of Patent: Aug. 1, 2017

(54) PREVENTION OF SRAM BURN-IN

(71) Applicant: International Business Machines Corporation, Armonk, NY (US)

(72) Inventor: Chandrasekharan Kothandaraman, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/197,308

(22) Filed: Jun. 29, 2016

(51) Int. Cl.
*G11C 11/00* (2006.01)
*G11C 11/419* (2006.01)
*G11C 11/418* (2006.01)
*H01L 27/11* (2006.01)
*H01L 23/522* (2006.01)
*H01L 23/528* (2006.01)
*H01L 21/768* (2006.01)

(52) U.S. Cl.
CPC .......... *G11C 11/419* (2013.01); *G11C 11/418* (2013.01); *H01L 21/76816* (2013.01); *H01L 21/76877* (2013.01); *H01L 23/528* (2013.01); *H01L 23/5226* (2013.01); *H01L 27/1104* (2013.01); *H01L 27/1116* (2013.01)

(58) Field of Classification Search
CPC ........................................ G11C 11/41–11/419
USPC ........................................ 365/154, 174, 17
See application file for complete search history.

(56) References Cited

U.S. PATENT DOCUMENTS

| | | | |
|---|---|---|---|
| 7,386,851 B1 * | 6/2008 | Zyuban ..................... | G06F 9/50 709/223 |
| 7,649,191 B2 | 1/2010 | Czubatyj et al. | |
| 7,978,505 B2 | 7/2011 | Zhou | |
| 8,861,254 B2 | 10/2014 | Gaillardon et al. | |
| 9,202,572 B2 | 12/2015 | Bronner et al. | |
| 2009/0183131 A1 * | 7/2009 | Bolam .................. | H01L 23/345 716/122 |
| 2012/0039117 A1 | 2/2012 | Webb | |
| 2012/0230129 A1 * | 9/2012 | Chandra ................ | G11C 29/06 365/189.011 |
| 2013/0021864 A1 * | 1/2013 | Deng ..................... | G11C 29/50 365/201 |
| 2015/0325278 A1 | 11/2015 | Bauer et al. | |

* cited by examiner

*Primary Examiner* — Han Yang
(74) *Attorney, Agent, or Firm* — Cantor Colburn LLP; Vazken Alexanian

(57) ABSTRACT

Embodiments are directed to a static random access memory (SRAM) device that prevents burn-in of potentially sensitive information. After an SRAM device is fabricated in a semiconductor material, a heating wire is placed in the layers above portions of the SRAM device. By applying current to the heating wire, a certain temperature is reached for a certain amount of time, and the burn-in of the SRAM is prevented. Other embodiments are also presented.

16 Claims, 4 Drawing Sheets

PREVENTION OF SRAM BURN-IN

BACKGROUND

The present invention relates in general to semiconductor devices. More specifically, the present invention relates to static random access memory (SRAM) and methods and systems of preventing burn-in.

SRAM is a common form of memory used in many types of systems. It has been found that certain conditions might result in data being burned-in to the SRAM, presenting a security risk.

SUMMARY

Embodiments are directed to a device comprising a plurality of static random access memory (SRAM) cells located on a semiconductor wafer, arranged in rows joined by word lines and columns joined by bit lines. The device further comprises at least one heating line located in a metal layer above the plurality of SRAM cells. The heating line is configured to heat at least a portion of the plurality of SRAM cells.

Embodiments are further directed to a method of forming an SRAM device. The method comprises forming a plurality of static random access memory (SRAM) cells located on a semiconductor wafer, arranged in rows joined by word lines and columns joined by bit lines. The method further comprises forming at least one heating line located in a metal layer above the plurality of SRAM cells. The heating line is configured to heat at least a portion of the plurality of SRAM cells.

Embodiments are further directed to a method of using an SRAM device. The method comprises applying power to the SRAM device. Information is then stored on the SRAM device. Current is applied to a heating wire located in the packaging of the SRAM device to avoid burn-in of information onto portions of the SRAM device.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

As previously noted herein, SRAM is a commonly used form of memory found in many different types of systems. Like dynamic RAM (DRAM), SRAM is only used when power is applied to the SRAM. Unlike DRAM, SRAM does not require periodic refreshing of the data being stored. Thus, SRAM is generally faster than DRAM. One common usage of SRAM is in microprocessors as a high-speed cache memory that provides faster access than main memory.

While SRAM is being powered, each SRAM memory cell stores a bit of information. For memory locations that are frequently accessed and changed, SRAM behaves in a predictable manner. However, a condition known as "burn-in" can develop if certain SRAM locations store the same data for an extended period of time. Burn-in can render data stored in the same SRAM locations for an extended period of time readable, even upon the removal of power, which is contrary to the desired and typical operation of SRAM. One type of unchanging information that is often stored in SRAM is cryptographic keys. If the memory locations containing cryptographic information are compromised, the information protected by the cryptographic keys can be at risk. The reasons for this will be explained in further detail below.

Figure 1:
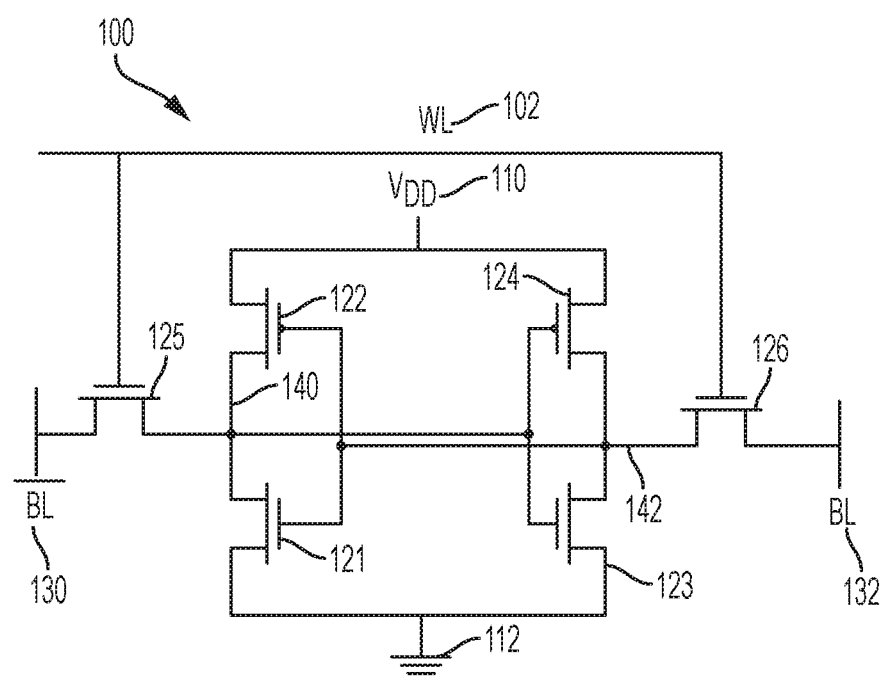
FIG. 1 depicts an exemplary SRAM memory cell.

With reference to FIG. 1, a known configuration of a 6-transistor complementary metal oxide semiconductor (CMOS) SRAM cell 100 is shown. A word line 102 is used to activate a particular cell to which data is to be written. A power source $V_{DD}$ 110 and a ground 112 is also present. Each bit of information is stored in four transistors 121, 122, 123, and 124 that form two cross-coupled inverters. As illustrated in FIG. 1, transistors 122 and 124 are p-type transistors while transistors 121 and 123 are n-type transistors. This storage cell has two stable states that are used denote 0 (zero) and 1 (one). Two additional access transistors 125 and 126 serve to control access to a storage cell during read and write operations. Access transistor 125 is coupled to node 140 and access transistor 126 is coupled to node 142. Other configurations, using varying numbers of transistors, also can be used.

The operation of SRAM cell 100 is well-known. To access memory cell 100 for a read operation, word line 102 is energized while bit lines 130 and 132 are allowed to float. Energizing word line 102 turns on access transistors 125 and 126, connecting storage nodes 140 and 142 to bit lines 130 and 132. The differential voltage developed on bit lines 130 and 132 is sensed and amplified by a sense amplifier (not shown). In a write operation, one of bit lines 130 and 132 is pulled to a logic low level, depending on the value of the bit that is being stored. When word line 102 is energized, the bit line that is low pulls down the storage node to which it is coupled (node 140 or 142), thereby causing the cross-coupled inverters to latch in the desired state, which will remain as long as power is applied to SRAM cell 100.

Figure 2:
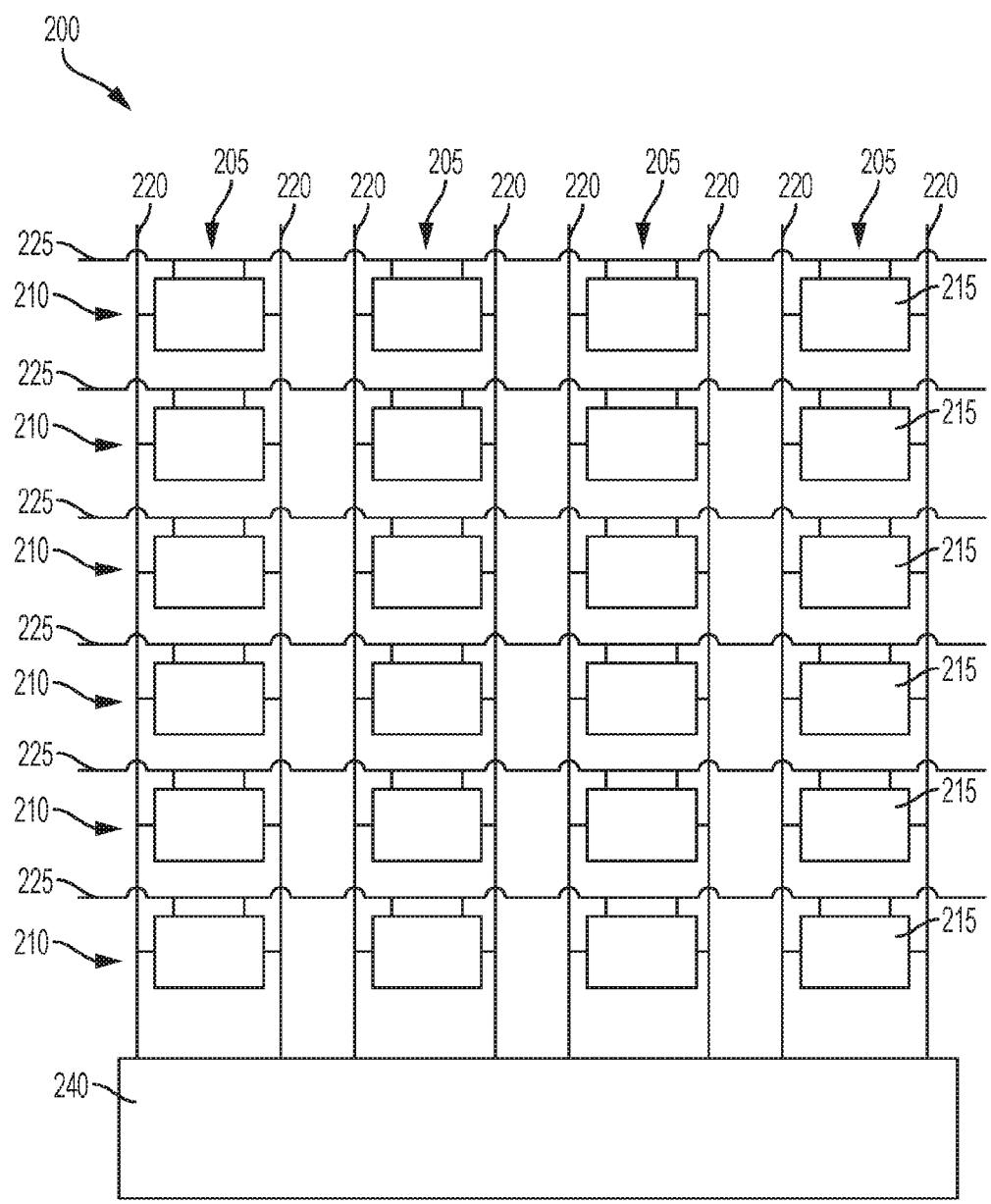
FIG. 2 depicts an exemplary layout of multiple SRAM memory cells.

Multiple implementations of SRAM cell 100 can be included in a memory array. In an example SRAM array configuration, the individual SRAM cells of the array are arranged in a grid pattern having columns and rows. FIG. 2 illustrates one example of an array 200 of SRAM cells 215 arranged in a grid pattern. Array 200 includes columns 205 and rows 210. Each column 205 includes a plurality of SRAM cells 215 coupled to each other by bit lines 220. Each row 210 includes at least one word line 225 coupled with at least a portion of each of the plurality of SRAM cells in the corresponding row. The individual SRAM cells that form SRAM cells 215 can be configured and arranged in a variety of manners, including but not limited to the configuration and arrangement of SRAM cell 100 shown in FIG. 1.

To read and/or write data to/from SRAM cells in a given row of the array 200, a word line 225 corresponding to a particular row is utilized to allow communication between memory cells of each one of the SRAM cells 215 in the row with corresponding bit lines 220. Various activation sequences for word lines, such as word lines 225, are known to those of ordinary skill. A data collection unit 240 (e.g., a multiplexer) might be utilized to process information to and from bit lines 220. It should be noted that although grid pattern arrangement 200 depicts four columns and six rows, one of ordinary skill will recognize that many configurations of rows and columns might be utilized as a grid pattern arrangement of SRAM cells.

It should also be understood that an actual SRAM device will have many more cells than illustrated in FIG. 2. An actual SRAM implementation might be as large as 8 MB or larger. A SRAM implementation might include additional connections and portions not illustrated in FIG. 2. For example, the voltage and ground connections are not illustrated in FIG. 2. Address decoders and sense amplifiers are also not illustrated, but are commonly included in SRAM implementations. Additional parts not illustrated in FIG. 2 might include pre-charge circuits, equalizing circuits, cell control modules, input/output buffers, and the like. When placed in a semiconductor package, an SRAM device will have additional layers placed atop the semiconductor layers. The package can have pins that enable external access to various areas of the SRAM device.

As technology advances, the feature size of semiconductors has become smaller. The smaller feature size has led to the materials used to create the storage cells being changed. In the past, silicon dioxide has been the material of choice for the gate oxide between the gate terminal of a transistor and the underlying source and drain terminals. However, there has been a trend of using "high-K" dielectrics, such as a hafnium oxide, as the gate oxide. A benefit of a high-K dielectric is that there is less power consumption and greater reliability at smaller feature sizes.

A downside of transistors using some types of high-K dielectric is the potential effect of Positive Bias Temperature Instability (PBTI). PBTI is caused by trapped electrons under positive gate bias. The result of PBTI is a change in the threshold voltage of affected n-type transistors. The end result for affected SRAM cells is that, during power up of the SRAM cell, the complement of the information previously stored in the SRAM cell might be readable.

Ideally, when an SRAM device is powered on, each memory cell of the SRAM device has a random bit of information. However, due to the PBTI effect mentioned above, instead of having random information, certain memory cells, particularly memory cells which previously contained unchanging information, might contain previously stored information or the complement of previously stored information. This effect is sometimes referred to as "burn-in" because it is more prevalent in memory locations which stored unchanging information. Because one common case of SRAM memory locations having unchanging data includes locations containing cryptographic keys, the result can be a security risk—the unchanging memory locations can be read to determine cryptographic keys.

The PBTI effect goes away with time. Given enough time, the threshold voltage of the effected transistors will return to normal. However, this process can take days, weeks, or even months. It has been found that the PBTI effect follows an Arrhenius relationship, in which the change in threshold voltage goes down linearly with respect to the log of the temperature. Thus, the time required to reverse this effect can be greatly reduced by the application of high temperatures for a brief period of time. It has been found that one combination of time and temperature that works to reduce or eliminate the PBTI effect is approximately 250 degrees Celsius for approximately 1-2 seconds. After an affected transistor is exposed to such conditions, the threshold voltage returns to normal and no burn-in effect remains.

In some embodiments, a method of creating a 250 degree temperature for 1 to 2 seconds involves the use of a heating wire. By placing a heating wire close to certain transistors, then applying a current through the wire, the nearby transistors will be exposed to a 250 degree temperature. By ensuring the heating wire is only near certain transistors, the SRAM device as a whole is not exposed to high temperatures.

Figure 3:
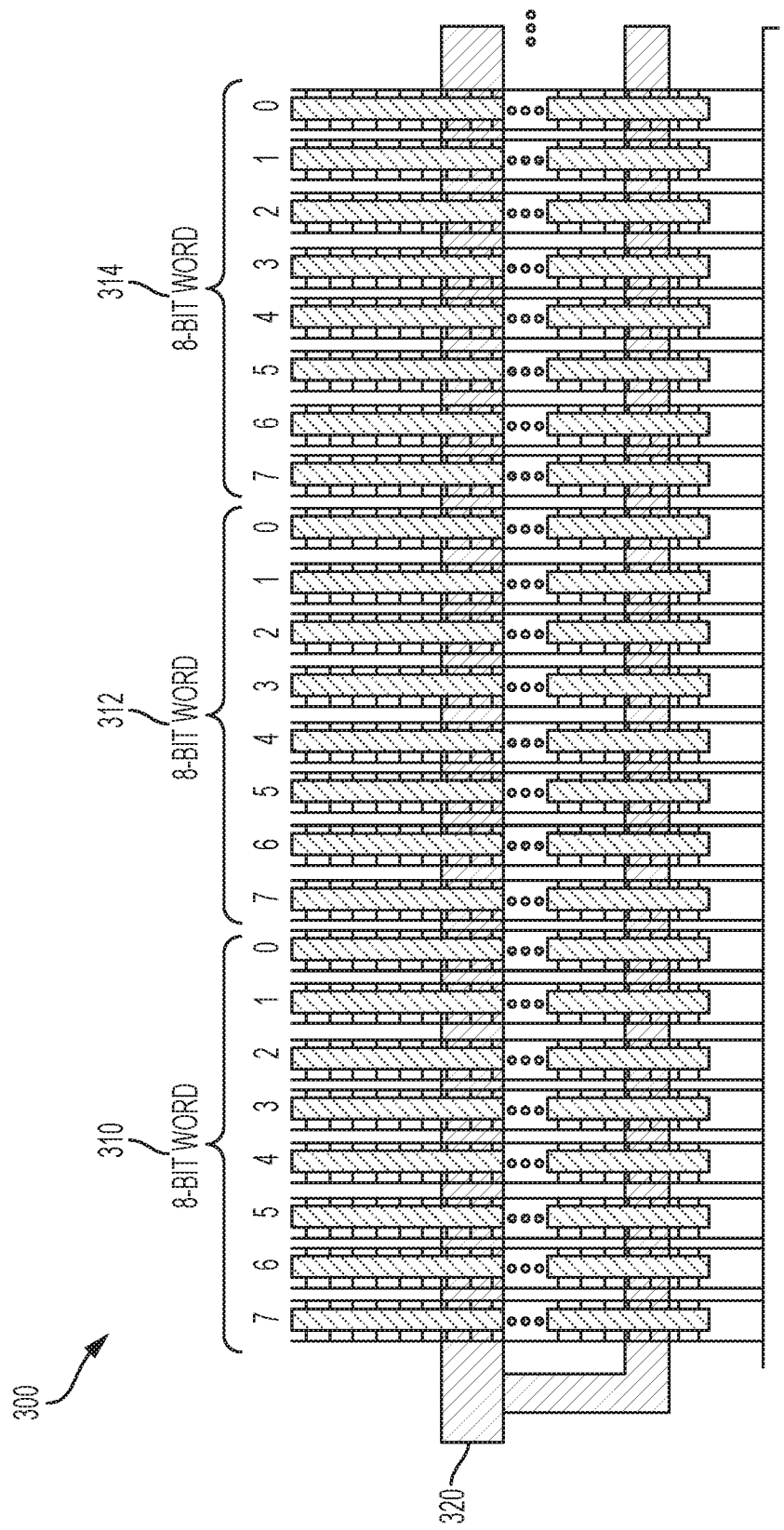
FIG. 3 depicts an exemplary layout of multiple SRAM memory cells of an embodiment.

The heating wire can be incorporated into the fabrication of the SRAM device. During the back end of line (BEOL) portion of fabrication, in addition to the wires that connect various transistors to each other, there can be a heating wire. In some embodiments, the heating wire is placed only over certain portions of the SRAM device. With reference to FIG. 3, an exemplary layout of an embodiment including a heating wire is illustrated.

FIG. 3 illustrates a larger portion of an SRAM device than does FIG. 2. Each of words 310, 312, and 314 contain 8 SRAM cells and the associated bit lines and complements of the bit lines. A series of lines are visible across each row, representing the word lines (WL). At each line is an SRAM cell. The SRAM cells of FIG. 3 are located on a semiconductor wafer.

Semiconductor wafers are typically fabricated using a front end of line (FEOL) process in which transistors are directly formed in the semiconductor material. After the formation of the transistors, the back end of line (BEOL) process takes place. The BEOL is where, inter alia, metal layers are placed to interconnect the various transistors and other electrical devices located on the semiconductor material. Eventually, each separate die on a wafer is separated, and then placed in a package. The package both protects the integrated circuit chip as well as providing pins, pads, and other manners in which to access the various elements of an integrated circuit chip.

Referring back to FIG. 3, atop a series of SRAM cells is a heating line 320. As described above, heating line 320 is in a metal layer above the semiconductor layers. While heating line 320 is illustrated as covering two to three rows of SRAM cells and word lines, it should be understood that an actual implementation of an embodiment can be a variety of widths, covering differing numbers of SRAM cells and their associated word lines. Heating line 320 is shown with two different branches, covering two separate sets of SRAM cells. It should be understood that there can be additional branches of heating lines of various different widths. In addition, there might be heating lines that travel orthogonally with respect to the illustrated heating line 320 (i.e., parallel to the bit lines).

It should also be understood that there can be more than one heating line in an SRAM device. Each heating line in an SRAM device might be coupled together. Thereafter, each heating line can be coupled to an externally accessible pin, pad, lead, or the like during the packaging phase of the production of the SRAM device.

In addition, it should be noted that although embodiments are described with reference to an "SRAM device," it is not limited to a device that contains only SRAM. SRAM might be located along with other components on a chip. For example, a microprocessor or system on a chip (SOC) might have on-board SRAM cells along with processing cores. Embodiments described above of can be implemented in such a package.

Figure 4:
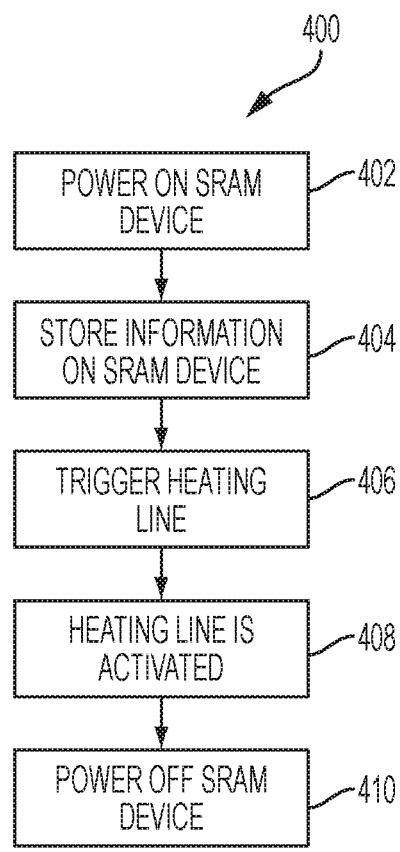
FIG. 4 depicts a method of using an SRAM memory device containing an embodiment.

A flowchart illustrating a method 400 of using an SRAM device of an embodiment is presented in FIG. 4. Method 400 is merely exemplary and is not limited to the embodiments presented herein. Method 400 can be employed in many different embodiments or examples not specifically depicted or described herein. In some embodiments, the procedures, processes, and/or activities of method 400 can be performed in the order presented. In other embodiments, the procedures, processes, and/or activities of method 400 can be performed in any other suitable order. In still other embodiments, one or more of the procedures, processes, and/or activities of method 400 can be combined or skipped.

Method 400 can be used with an SRAM device such as SRAM device 300. As described above, a predesignated portion of SRAM cells is close to a heating element. In actual use, the predesignated portion of SRAM cells that are close to the heating element are publicized, such as on a datasheet, such that users of the SRAM device will know where to store sensitive information. After the SRAM device is powered up (block 402), the SRAM device is used in the traditional manner. As such, information is stored in the SRAM device (block 404). This can include sensitive information, such as cryptographic keys, that is stored in the predesignated portion of memory cells. A heating is triggered (block 406). There can be a variety of different events that cause the triggering. For example, there can be an instruction sent to the SRAM device requesting the heating. The heating might be triggered automatically upon a request to power down the IC. The triggering might be triggered periodically, such as every X number of hours.

Upon the triggering of the heating, a current is applied to the heating wire (block 408). The amount of current is relatively small (on the order of milliamps) and the current is applied for a brief amount of time (approximately 1-2 seconds). The result is a localized temperature of up to 250 degrees Celsius in the areas near the heating wire. This heating resets the threshold voltage of the transistors in the predesignated portion of memory cells, eliminating the burn-in effect. In some embodiments, the time can be controlled internal to the SRAM device, such as via a timing circuit.

After the SRAM device is powered down (block 410), the predesignated portion of memory cells contains random information, instead of containing the complement of the information previously stored. In such a manner, the security risks of storing sensitive information can be obviated by storing sensitive information in the predesignated portion of memory cells.

Thus, it can be seen from the forgoing detailed description and accompanying illustrations that embodiments of the present invention provide structures and methodologies for preventing the burn-in of SRAM devices. As described above, one or more embodiments provide an SRAM device with a heating line that can be used to heat portions of SRAM memory to a specific temperature for a short period of time. Using the methodologies described herein to expose a SRAM cells to the specific temperature for a short period of time resets the threshold voltage of those SRAM cells, preventing a "burn-in" of those SRAM cells.

The method and system as described above is used in the fabrication of integrated circuit chips. The resulting integrated circuit chips can be distributed by the fabricator in raw wafer form (that is, as a single wafer that has multiple unpackaged devices), as a bare die, or in a packaged form. In the latter case the device is mounted in a single chip package (such as a plastic carrier, with leads that are affixed to a motherboard or other higher level carrier) or in a multichip package (such as a ceramic carrier that has either or both surface interconnections or buried interconnections). In any case, integrated circuit chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments have been presented for purposes of illustration, but are not intended to be exhaustive or limited to the embodiments described above. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description herein has been presented for purposes of illustration and description, but is not intended to be exhaustive or limited to the embodiments in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A device comprising:
    a plurality of static random access memory (SRAM) cells located on a semiconductor wafer, arranged in rows joined by word lines and columns joined by bit lines;
    at least one heating line located in a metal layer above the plurality of SRAM cells; wherein:
    the heating line is configured to heat at least a portion of the plurality of SRAM cells; and
    the heating line is arranged to be powered to result in a temperature for an amount of time that is sufficient to remove a positive bias temperature instability from the device.

2. The device of claim 1 wherein the heating line is arranged to reach a temperature of approximately 250 degrees Celsius.

3. The device of claim 1 further comprising:
    a timing circuit coupled to the heating line;
    wherein the timing circuit is arranged to limit a time during which the heating line is powered.

4. The device of claim 3 wherein the timing circuit is arranged to limit the time during which the heating line is powered to approximately 2 seconds.

5. The device of claim 1 further comprising:
a package to surround the device, including a plurality of pins;
wherein the heating line is coupled to at least one pin of the plurality of pins.

6. The device of claim 1 wherein the heating line is arranged to traverse in a direction parallel to the word lines such that at least one row of SRAM cells and word lines are covered by the heating line.

7. The device of claim 1 wherein the heating line is arranged to traverse in a direction parallel to the bit lines such that at least one column of SRAM cells and bit lines are covered by the heating line.

8. A method of forming an SRAM device comprising:
forming a plurality of static random access memory (SRAM) cells located on a semiconductor wafer, arranged in rows joined by word lines and columns joined by bit lines;
forming at least one heating line located in a metal layer above the plurality of SRAM cells; wherein:
the heating line is configured to heat at least a portion of the plurality of SRAM cells; and
the heating line is arranged to be powered to result in a temperature for an amount of time that is sufficient to remove a positive bias temperature instability from the device.

9. The method of claim 8 wherein the heating line is arranged to reach a temperature of approximately 250 degrees Celsius.

10. The method of claim 8 further comprising:
forming a timing circuit coupled to the heating line;
wherein the timing circuit is arranged to limit a time during which the heating line is powered.

11. The method of claim 10 wherein the timing circuit is arranged to limit the time during which the heating line is powered to approximately 2 seconds.

12. The method of claim 8 further comprising:
placing the device in a package surrounding the device, including a plurality of pins;
wherein the heating line is coupled to at least one pin of the plurality of pins.

13. The method of claim 8 wherein the heating line is arranged to traverse in a direction parallel to the word lines such that at least one row of SRAM cells and word lines are covered by the heating line.

14. The method of claim 8 wherein the heating line is arranged to traverse in a direction parallel to the bit lines such that at least one column of SRAM cells and bit lines are covered by the heating line.

15. A method of using an SRAM device comprising:
applying power to the SRAM device;
storing information on the SRAM device; and
applying current to a heating wire located in the packaging of the SRAM device to avoid burn-in of information onto portions of the SRAM device; wherein:
applying current to the heating wire comprises applying current sufficient to raise a localized temperature to 250 degrees Celsius; and
applying current to the wire comprises applying current for approximately 1 to 2 seconds.

16. The method of claim 15 further comprising:
repeating the applying current step in a periodic manner.

* * * * *